(12) United States Patent
Guy

(10) Patent No.: US 12,205,639 B2
(45) Date of Patent: Jan. 21, 2025

(54) MEMORY DEVICE AND PROGRAMMING METHOD THEREOF

(71) Applicant: Taiwan Semiconductor Manufacturing Company, Ltd., Hsinchu (TW)

(72) Inventor: Jeremy Guy, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 151 days.

(21) Appl. No.: 17/893,157

(22) Filed: Aug. 22, 2022

(65) Prior Publication Data

US 2024/0062814 A1 Feb. 22, 2024

(51) Int. Cl.
  *G11C 11/56* (2006.01)
  *G11C 13/00* (2006.01)

(52) U.S. Cl.
  CPC ...... *G11C 11/5685* (2013.01); *G11C 13/0007* (2013.01); *G11C 13/0069* (2013.01); *G11C 11/5614* (2013.01); *G11C 11/5678* (2013.01); *G11C 13/0064* (2013.01); *G11C 13/0097* (2013.01)

(58) Field of Classification Search
  CPC ............ G11C 11/5614; G11C 11/5678; G11C 11/5685; G11C 13/0007; G11C 13/0067; G11C 13/0069; G11C 13/0097

USPC ..................................................... 365/185.03
See application file for complete search history.

(56) References Cited

U.S. PATENT DOCUMENTS

| | | | | |
|---|---|---|---|---|
| 8,351,251 B2* | 1/2013 | Eleftheriou | ............. | G11C 11/21 365/158 |
| 8,934,298 B2* | 1/2015 | Park | ...................... | G11C 16/10 365/185.02 |
| 11,152,066 B1* | 10/2021 | Khwa | ................. | G11C 13/0064 |
| 2010/0284212 A1* | 11/2010 | Bedeschi | ........... | G11C 13/0069 365/163 |
| 2011/0069538 A1* | 3/2011 | Lam | .................... | G11C 13/0004 365/163 |

* cited by examiner

*Primary Examiner* — Ly D Pham
(74) *Attorney, Agent, or Firm* — JCIPRNET (57) ABSTRACT

A programming method of a memory device comprising a multi-level cell is introduced. The programming method includes applying a sequence of program pulses comprising at least one set pulse and at least one reset pulse to the multi-level cell; determining whether the resistance of the multi-level cell is in a target range after each program pulse of the sequence of program pulses is applied to the multi-level cell; keeping applying the sequence of program pulses to the multi-level cell in response to determining that the resistance of the multi-level cell is not in the target range; and stopping applying the sequence of program pulses to the multi-level cell in response to determining that the resistance of the multi-level cell is in the target range.

20 Claims, 8 Drawing Sheets

MEMORY DEVICE AND PROGRAMMING METHOD THEREOF

BACKGROUND

A multi-level cell (MLC) is capable of storing multiple bits of information in a single MLC. The MLC relies on a sufficient memory window to store multiple levels, wherein the memory window of the MLC corresponding to a range from a storable lowest level and a storable highest level of the MLC. Due to limited control in a middle range of the memory window, only a portion of the memory window can be used, resulting in a low number of storable levels and low data storage density.

In addition, an incremental step pulse programming (ISPP) scheme is usually utilized to program the MLC to a target level. However, due to intrinsic variability (i.e., device-to-device variability and/or cycle to cycle variability) of the MLC, the existing ISPP scheme may lead to over-programming beyond the target level, especially when the target level being in the middle range of the memory window. Furthermore, a spread of each level may not be controlled properly because of the intrinsic variability of the MLC.

It is desirable for a creative programming method that is capable of precisely programming the MLC to the target level range regardless of the intrinsic variability in the MLC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or decreased for clarity of discussion.

DESCRIPTION OF THE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting.

Figure 1:
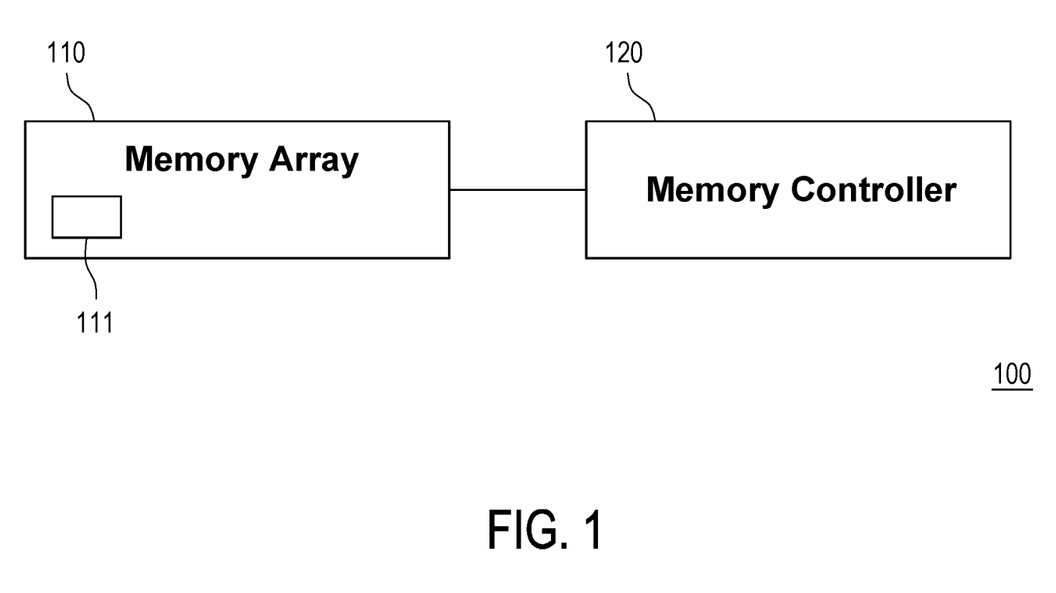
FIG. 1 is a block diagram of a memory device in accordance with some embodiments.

FIG. 1 illustrates a block diagram of a memory device 100 including a memory array 110 and a memory controller 120 in accordance with some embodiments. The memory array 110 may be a non-volatile memory array that is capable of retaining stored data after removing power supply. The memory array 110 may include a plurality of multi-level cells (MLCs) 111, and each MLC 111 may store a plurality of bits of information corresponding to a plurality of resistance levels of each MLC 111. The MLCs 111 may be coupled to a plurality of bit lines (not shown), a plurality of word lines (not shown) and a plurality of source lines (not shown), and memory operations such as a read operation, a program operation and an erase operation may be performed to the MLCs 111 through the bit lines, the word lines and the source lines. In some embodiments, the MLCs 111 are resistive random-access memory (RRAM) cells, but the disclosure is not limited thereto. Each MLC 111 may be an oxide-based random-access memory (OxRAM) cell, a conductive bridging random-access memory (CBRAM) cell, a phase-change random-access memory (PCRAM) cell or any other suitable type of a memory cell.

The memory controller 120 is coupled to the memory array 110 and is configured to control the memory operations on the MLCs 111 of the memory array 110. The memory controller 120 may select at least MLC 111 among the MLCs of the memory array 110 for memory operation. The memory controller 120 may apply appropriate bias voltages to the selected MLC 111 through the bit line, the word line and the source line being coupled to the selected MLC 111. In some embodiments, the memory controller 120 may utilize an incremental step pulse programming (ISPP) scheme to perform the program operation on the selected MLC 111. In other words, the memory controller 120 may apply a sequence of program pulses to the selected MLC 111 to program the selected MLC 111 to a target range. The sequence of program pulses may include at least one set pule and at least one reset pulse, in which the at least one reset pulse is configured to increase the resistance of the MLC 111 and the at least one set pulse is configured to decrease the resistance of the MLC 111. The at least one reset pulse may include incremental step reset pulses with increasing amplitude, increasing pulse duration, increasing pulse count or a combination of thereof. The at least one set pulse may include incremental step set pulses with increasing amplitude, increasing pulse duration, increasing pulse count or a combination thereof. A step of the incremental step reset pulses may be referred to as a reset step, a step of the incremental step set pulses may be referred to as a set step.

Figure 2:
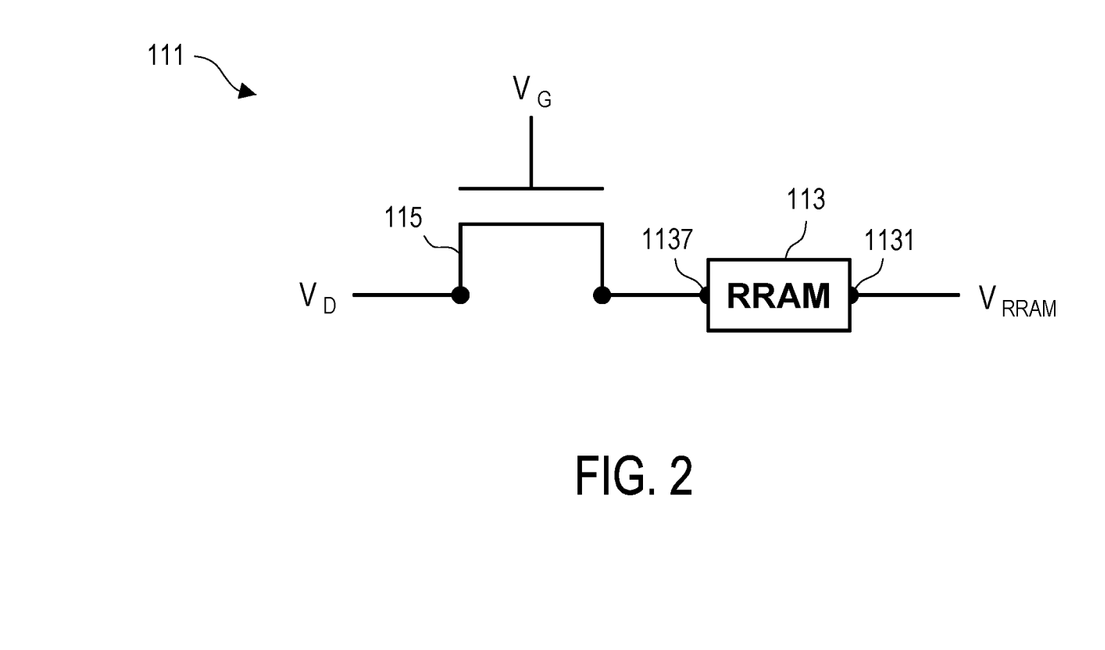
FIG. 2 is a block diagram of a multi-level cell (MLC) in accordance with some embodiments.

FIG. 2 illustrates a block diagram of the MLC 111 in accordance with some embodiments. The MLC 111 may include a resistive memory element 113 and a transistor 115 that is coupled in series to the resistive memory element 113. The resistive memory element 113 may have a plurality of resistance levels corresponding to storable logic states of the MLC 111. For example, when the MLC 111 is a double-level cell, the resistive memory element 113 may have four resistance levels corresponding to logic states of "11", "10", "01" and "00". When the MLC 111 is a triple-level cell, the resistive memory element 113 may have eights resistance levels corresponding to logic states of "111", "110", "101", "100", "011", "010", "001" and "000". The resistive memory element 113 of the MLC 111 may include a first electrode 1131 and a second electrode 1137. The first electrode 1131 may receive a voltage $V_{RRAM}$ and the second electrode 1137 is coupled to a first terminal (i.e., source terminal) of the transistor 115. However, the disclosure is not limited thereto. The first electrode 1131 may be coupled to the first terminal of the transistor 115, and the second electrode 1137 may receive the voltage $V_{RRAM}$ in some alternative embodiments.

The transistor 115 may include the first terminal (i.e., source terminal), a second terminal (i.e., drain terminal) and a control terminal (i.e., gate terminal). The first terminal of the transistor 115 is coupled to the second electrode 1137 of the resistive memory element 113, the second terminal of the transistor receives a voltage $V_D$, and the control terminal of the transistor 115 receives a current-control voltage $V_G$. A current flowing through the resistive memory element 113 of the MLC 111 is controlled by the current-control voltage $V_G$, and a memory operation on the MLC 111 may be controlled by the voltages $V_{RRAM}$ and $V_D$. The memory operation may be a program operation that is configured to program the MLC 111 to a target range corresponding to a target logic state. During the program operation, the memory controller may apply at least one reset pulse and at least one set pulse to the MLC until the resistance of the MLC 111 falls within the target range. The program operation is in a reset state when the at least one reset pulse is applied to the MLC 111, and the program operation is in a set state when the at least one set pulse is applied to the MLC 111.

Figure 3A:
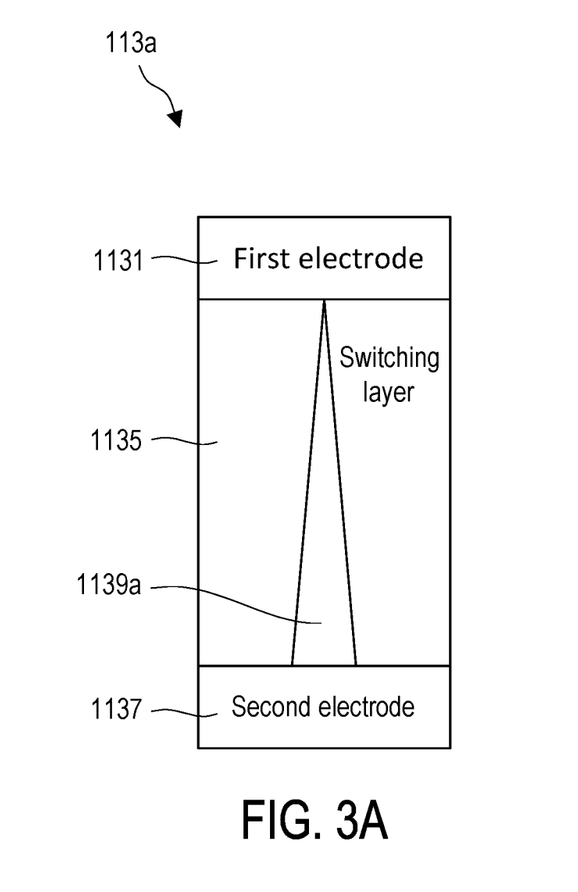
FIG. 3A and FIG. 3B are block diagrams of a resistive memory element of a MLC in in accordance with some embodiments.

FIG. 3A illustrates a conductive filament 1139a formed in a resistive memory element 113a of a MLC (i.e., MLC 111 in FIG. 2) when incremental step set pulses are applied to the MLC 111 during a program operation in accordance with some embodiments. The resistive memory element 113a may be same as the resistive memory element 113 of the MLC 111 shown in FIG. 2. The resistive memory element 113a may include a first electrode 1131, a switching layer 1135 and a second electrode 1137. When the incremental step set pulses which are positive pulses are applied to the first electrode 1131 of the resistive memory element 113a, an electric field from the first electrode 1131 to the second electrode 1137 is generated. The generated electric field may cause oxygen vacancies (i.e., positive charges) to gradually mitigate to the switching layer 1135 to form the conductive filament 1139a. The oxygen vacancies may be generated at the interface between the first electrode 1131 and switching layer 1135. The formation of the conductive filament 1139a may decrease the resistance of the MLC. A structure (i.e., shape and/or length) of the conductive filament 1139a may correspond to a specific resistance level (or a specific logic state) of the MLC. The assertion of the incremental step set pulses to the first electrode 1131 of the resistive memory element 113a may gradually decrease the resistance of the MLC to the target range corresponding to target resistance level (or the target logic state) of the MLC.

Figure 3B:
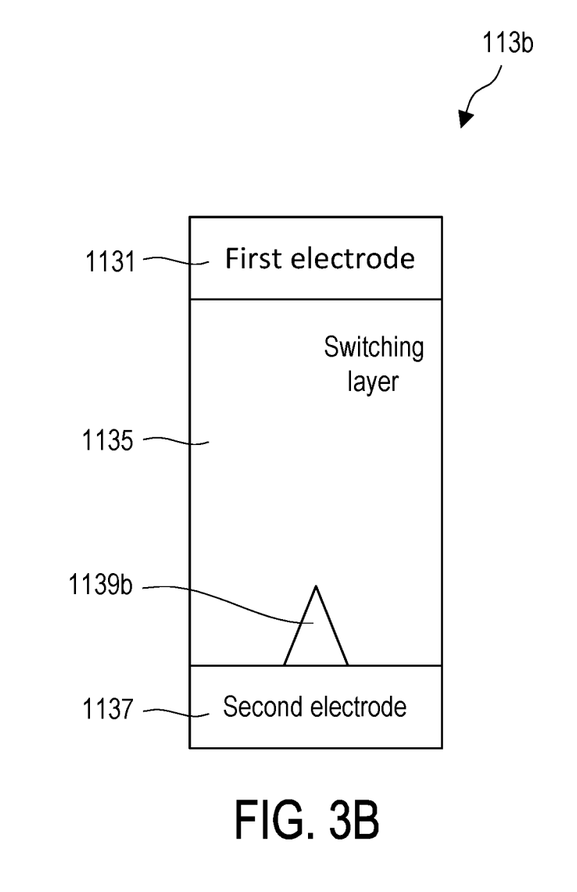

FIG. 3B illustrates a conductive filament 1139b in a resistive memory element 113b of a MLC (i.e., MLC 111 in FIG. 2) when incremental step reset pulses are applied to the MLC 111 during a program operation in accordance with some embodiments. Referring to FIG. 3A and FIG. 3B, same components of the resistive memory element 113a and the resistive memory element 113b are represented by same reference numbers. When the incremental step reset pulses are applied to the second electrode 1137 of the resistive memory element 113b, an electric field from the second electrode 1137 to the first electrode 1131 is generated. The generated electric field may cause oxygen vacancies (i.e., positive charges) to gradually disappeared from the switching layer 1135. The rupture of the conductive filament 1139b in the switching layer 1135 may increase the resistance of the MLC. In some embodiments, a structure (i.e., shape and/or length) of the conductive filament 1139b may correspond to a specific resistance (or a specific logic state) of the MLC. The assertion of the incremental step reset pulses to the second electrode 1137 of the resistive memory element 113b may gradually increase the resistance of the MLC to the target range corresponding to target resistance level (or the target logic state) of the MLC.

Figure 4A:
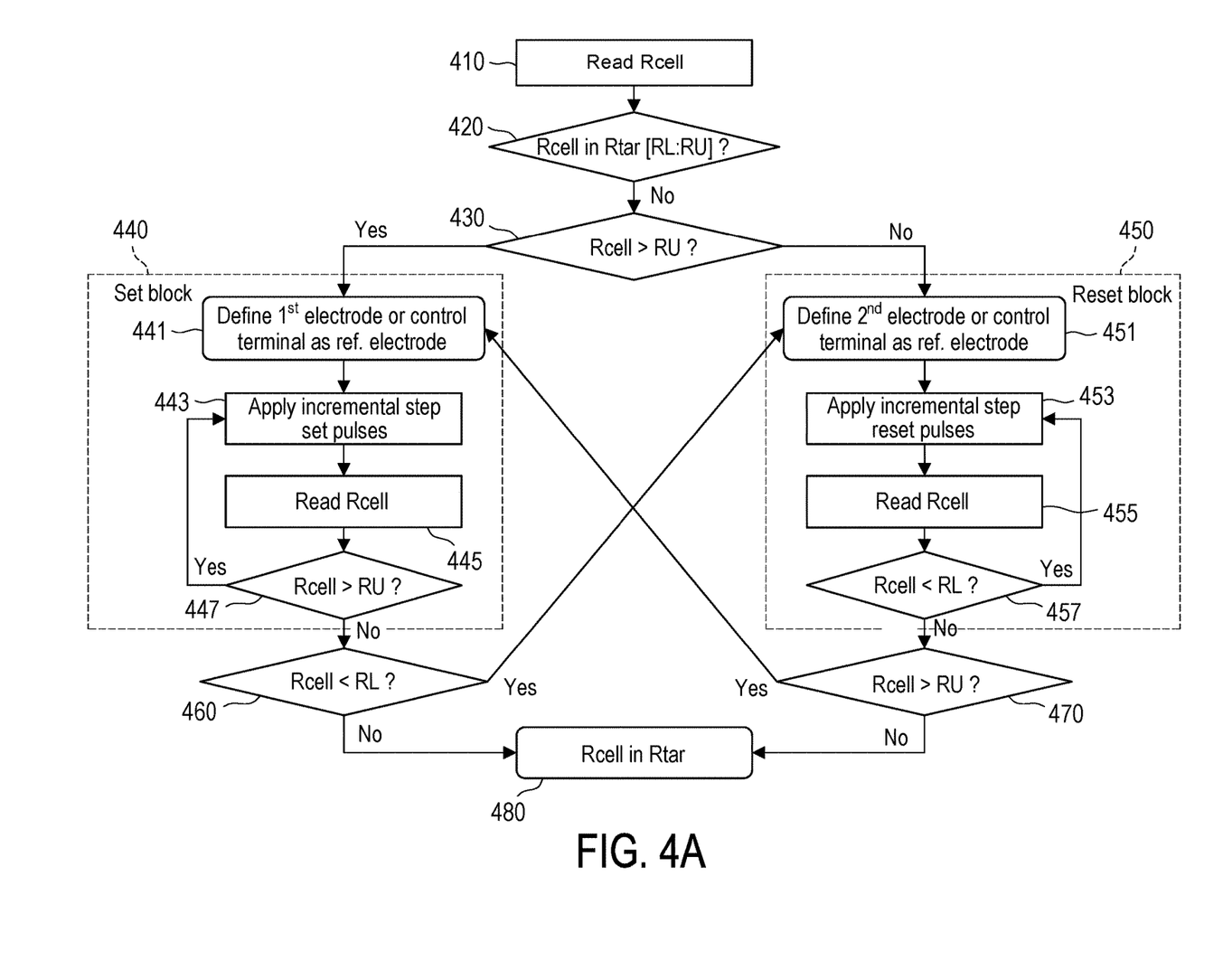
FIG. 4A and FIG. 4B are flowchart diagrams of program operations in accordance with some embodiments.

FIG. 4A illustrates a flowchart diagram of a program operation performed on a MLC in accordance with some embodiments. The blocks in the flowchart diagram shown in FIG. 4A may be executed by the memory controller (i.e., memory controller 120 in FIG. 1). The program operation is configured to set a resistance Rcell of the MLC to be within a target range Rtar which is defined by an upper limit RU and a lower limit RL.

In blocks 410 and 420, the resistance Rcell of the MLC is read out and is compared with the target range Rtar to determine whether the resistance Rcell of the MLC is within the target range Rtar. When the resistance Rcell of the MLC is not within the target range Rtar, the controller may determine whether the resistance Rcell is greater than the upper limit RU of the target range Rtar in block 430. When the resistance Rcell is greater than the upper limit RU of the target range Rtar (Yes in block 440), the memory controller proceeds to block 440 (set block). When the resistance Rcell is not within the target range Rtar and the resistance Rcell is not greater than the upper limit RU of the target range Rtar (No in block 440), the memory controller determines that the resistance Rcell is less than the lower limit RL of the target range Rtar and the memory controller proceeds to block 450 (reset block).

In block 440 (set block), the memory controller is configured to decrease the resistance Rcell of the MLC until the resistance Rcell is less than or equal to the upper limit RU of the target range Rtar. In the set block or the set operation, the first electrode of the MLC 111 and the gate terminal of the transistor 115 are active to decrease the resistance Rcell of the MLC 111. The block 440 may include sub-blocks 441, 443, 445 and 447. In the sub-block 441, the first electrode of the MLC (i.e., the first electrode 1131 of the MLC 111 in FIG. 2) or the control terminal (i.e., control terminal of the transistor 115 of the MLC 111 in FIG. 2) is defined as a reference electrode for applying incremental step set pulses. In the sub-blocks 443 to 447, the incremental step set pulses are successively applied to the first electrode of the MLC or the control terminal of the transistor 115 to decrease the resistance Rcell of the MLC until the resistance Rcell is less than or equal to the upper limit RU of the target range Rtar. In other words, the incremental step set pulses are successively applied to the first electrode of the MLC or the control terminal of the transistor 115 until the resistance Rcell of the MLC is within the target range Rtar or until the resistance Rcell of the MLC is less than target range Rtar. When the incremental step set pulses are successively applied to the first electrode of the MLC, the current-control voltage $V_G$ applied to the control terminal of the transistor 115 may be fixed at a predetermined voltage. When the incremental step set pulses are successively applied to the control terminal of the transistor 115, the voltage applied to the first electrode of the MLC 111 may be fixed at the predetermined voltage. After each set pulse of the incremental step set pulses is applied to the first electrode of the MLC or the control terminal of the transistor 115 (sub-block 443), the resistance Rcell of the ML is read out (sub-block 445), and the readout resistance Rcell is compared to the upper limit RU of the target range Rtar (sub-block 447). When the readout resistance Rcell is greater than the upper limit RU of the target range Rtar (Yes in sub-block 447), the memory controller proceeds the sub-block 443 to apply a subsequent set pulse in the incremental step set pulses to the MLC. The operations in sub-blocks 443, 445 and 447 are repeatedly executed until the resistance Rcell is less than or equal to the upper limit RU of the target range Rtar. In order to avoid an infinitive loop operation, the operation in block 440 is stopped when the resistance Rcell is consistently greater than the upper limit RU of the target range Rtar after applying a predetermined number of set pulses to the MLC. When the resistance Rcell of the MLC is less than or equal to the upper limit RU of the target range Rtar (No in sub-block 447), the memory controller proceeds to block 460.

In block 460, the memory controller determines whether the resistance Rcell of the MLC is less than the lower limit RL of the target range Rtar. When the resistance Rcell of the MLC is not less than the lower limit RL of the target range Rtar (No in block 460), it determines that the resistance Rcell of the MLC is within the target range Rtar (block 480), and the program operation is ended successfully. When the resistance Rcell of the MLC is less than the lower limit RL of the target range Rtar (Yes in block 460), the memory controller determines that the MLC is over-programming and the resistance Rcell goes beyond the target range Rtar. When memory controller determines that resistance Rcell goes beyond the target range Rtar, the memory controller proceeds to block 450 (reset block), so as to increase the resistance Rcell of the MLC.

In block 450 (or reset block), the memory controller is configured to increase the resistance Rcell of the MLC until the resistance Rcell is greater than or equal to the lower limit RL of the target range Rtar. In the reset block or the reset operation, the second electrode of the MLC 111 and the gate terminal of the transistor 115 are active to increase the resistance Rcell of the MLC 111. The block 450 may include sub-blocks 451, 453, 455 and 457. In the sub-block 451, the second electrode of the MLC (i.e., the second electrode 1137 of the MLC 111 in FIG. 2) or the control terminal (i.e., control terminal of the transistor 115 of the MLC 111 in FIG. 2) is defined as a reference electrode for applying incremental step reset pulses. In the sub-blocks 453 to 457, incremental step reset pulses are successively applied to the second electrode of the MLC or to the control terminal of the transistor 115 of the MLC to increase the resistance Rcell of the MLC until the resistance Rcell is greater than or equal to the lower limit RL of the target range Rtar. In other words, the incremental step reset pulses are successively applied to the second electrode of the MLC or the control terminal of the transistor 115 of the MLC until the resistance Rcell of the MLC is within the target range Rtar or until the resistance Rcell of the MLC is greater than target range Rtar. When the incremental step reset pulses are successively applied to the second electrode of the MLC, the current-control voltage $V_G$ applied to the control terminal of the transistor 115 may be fixed at a predetermined voltage. When the incremental step reset pulses are successively applied to the control terminal of the transistor 115, the voltage applied to the second electrode of the MLC 111 may be fixed at the predetermined voltage. After each reset pulse of the incremental step reset pulses is applied to the second electrode of the MLC or the control terminal of the transistor 115 (sub-block 453), the resistance Rcell of the ML is read out (sub-block 455), and the readout resistance Rcell is compared to the lower limit RL of the target range Rtar (sub-block 457). When the readout resistance Rcell is less than the lower limit RL of the target range Rtar (Yes in sub-block 457), the memory controller proceeds the sub-block 453 to apply a subsequent reset pulse in the incremental step reset pulses to the MLC. The operations in sub-blocks 453, 455 and 457 are repeatedly executed until the resistance Rcell is greater than or equal to the lower limit RL of the target range Rtar. In order to avoid an infinitive loop operation, the operation in block 450 is stopped when the resistance Rcell is consistently less than the lower limit RL of the target range Rtar after applying a predetermined number of reset pulses to the MLC. When the resistance Rcell of the MLC is greater than or equal to the lower limit RL of the target range Rtar (No in sub-block 457), the memory controller proceeds to block 470.

In block 470, the memory controller determines whether the resistance Rcell of the MLC is greater than the upper limit RU of the target range Rtar. When the resistance Rcell of the MLC is not greater than the upper limit RU of the target range Rtar (No in block 470), the memory controller determines that the resistance Rcell of the MLC is within the target range Rtar (block 480), and the program operation is performed successfully. When the resistance Rcell of the MLC is greater than the upper limit RU of the target range Rtar (Yes in block 470), the memory controller determines that the MLC is over-programming and the resistance Rcell passes the target range Rtar. When it determines resistance Rcell passes the target range Rtar, the memory controller proceeds to block 440 (set block), so as to decrease the resistance Rcell of the MLC.

The memory controller may apply program pulses including both incremental step set pulses and incremental step reset pulses to the MLC in a single program operation. Each program pulse may behave as a reset pulse when the resistance Rcell of the MLC goes beyond the target range Rtar (i.e., the resistance Rcell is less than the lower limit RL of the target range Rtar). Each program pulse may behave as a set pulse when the resistance Rcell of the MLC passed the target range Rtar (i.e., the resistance Rcell is greater than the upper limit RU of the target range Rtar). The memory controller may repeatedly apply incremental step set pulses and incremental step reset pulse in the single program operation until the resistance Rcell of the MLC falls within the target range Rtar. In this way, the memory controller may precisely program the MLC to the target range (or the target logic state) regardless of intrinsic variability (i.e., device-to-device variability and/or cycle-to-cycle variability) of the MLC. In addition, since the MLC is precisely programmed to the target range, the spread of each resistance level may be precisely controlled, the intermediate resistance levels corresponding to the middle range of the memory window is precisely controlled, and a number of storable resistance levels is high.

Figure 4B:
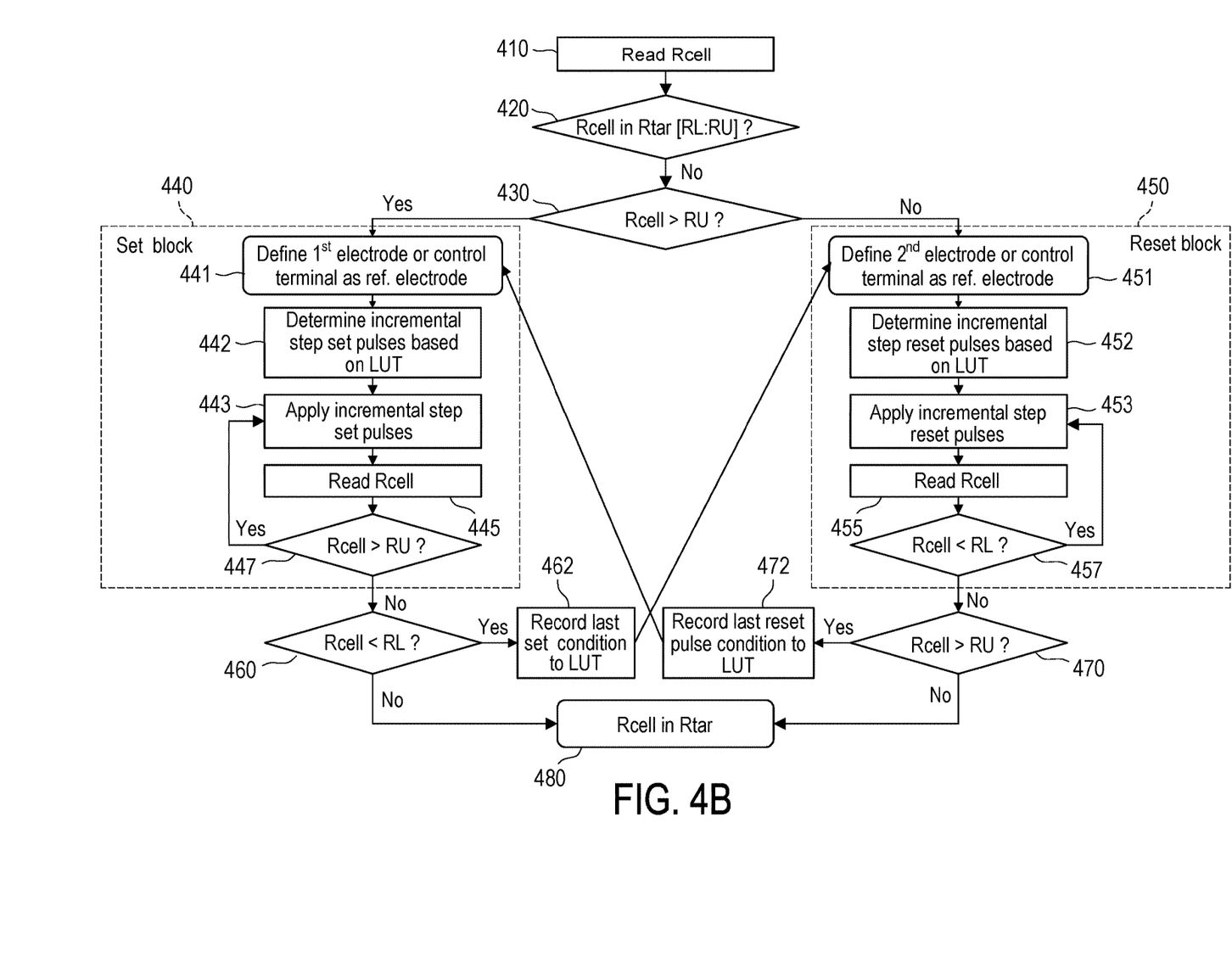

FIG. 4B illustrates a flowchart diagram of a program operation of performed on MLC in accordance with some embodiments. Referring to FIG. 4A and FIG. 4B, same blocks of the flowchart diagram shown in FIG. 4A and the flowchart diagram shown in FIG. 4B are represented by same reference numbers. A difference between the flowchart in FIG. 4A and the flowchart in FIG. 4B is that the flowchart in FIG. 4B further shows blocks 442, 452, 462 and 472. When the memory controller determines that the resistance Rcell of the MLC is less than the lower limit RL of the target range Rtar (Yes in block 460), a last set condition is recorded to a lookup table (LUT) (block 462). The last set condition may include an amplitude (i.e., voltage level), a pulse width, a pulse count or other information of the last set pulse among the incremental step set pulses applied to the MLC. The assertion of the last set pulse to the MLC causes the resistance Rcell of the MLC goes beyond the target range Rtar.

When the memory controller determines that the resistance Rcell of the MLC is greater than the upper limit RU of the target range Rtar (Yes in block 470), a last reset condition is recorded to the LUT (block 472). The last reset condition may refer to an amplitude (i.e., voltage level), a pulse width, a pulse count or other information of the last reset pulse among the incremental step reset pulses applied to the MLC. The assertion of the last reset pulse to the MLC causes the resistance Rcell of the MLC passes the target range Rtar.

In block 442, the memory controller may determine the incremental step set pulses based on LUT to be applied to the MLC based on the last set condition recorded in the LUT. In some embodiments, the memory controller may use the at least one of the amplitude, the pulse width or the pulse count of the last set pulse recorded in the LUT for determining the incremental step set pulses to be applied to the MLC. For example, the memory controller may downsize the at least one of the amplitude, the pulse width or the pulse count of the last set pulse stored in the LUT by at least one step to determine the incremental step set pulses to be applied to the MLC. The step may refer a difference in at least one of the amplitude, the pulse width or the pulse count of successive set pulses in the incremental step set pulses.

In block 452, the memory controller may determine the incremental step reset pulses based on LUT to be applied to the MLC based on the last reset condition recorded in the LUT. In some embodiments, the memory controller may use the at least one of the amplitude, the pulse width or the pulse count of the last reset pulse recorded in the LUT for determining the incremental step reset pulses to be applied to the MLC. For example, the memory controller may downsize the at least one of the amplitude, the pulse width or the pulse count of the last reset pulse stored in the LUT by at least one step to determine the incremental step reset pulses to be applied to the MLC. The step may refer a difference in at least one of the amplitude, the pulse width or the pulse count of successive reset pulses in the incremental step reset pulses.

In some embodiments, the LUT is configured to record the last set condition and the last reset condition for each resistance level of the MLC. If the MLC has n resistance levels corresponding to n logic states, the LUT may store the last set condition and the last reset condition for each of the n resistance levels. In addition, since the last set condition and the last reset condition in the LUT is changeable overtime during the program operation, the LUT may also referred to as a fly LUT. Since the incremental step set pulses and the incremental step reset pulses are determined based on the last set condition and the last reset condition recorded in the LUT, the resistance Rcell of the MLT may fall within the target range Rtart quickly. In this way, the speed of the program operation to the MLC is improved.

Figure 5:
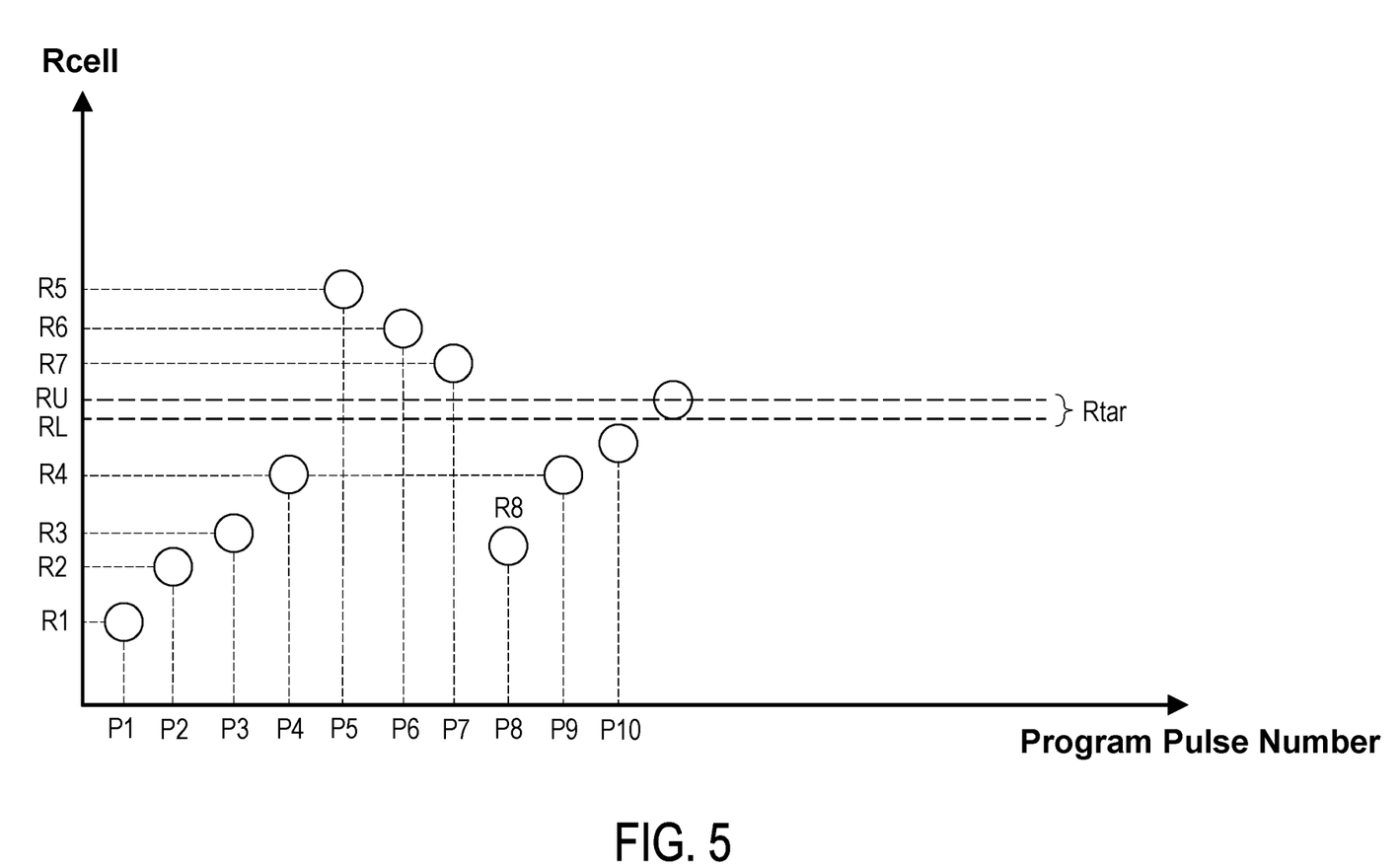
FIG. 5 is a diagram illustrating a change of resistance of the MLC during a program operation in accordance with some embodiments.

FIG. 5 is a diagram illustrating a change of the resistance of the MLC during a program operation in accordance with some embodiments. A vertical axis of the diagram represents the resistance of the MLC, and the horizontal axis represents a number of program pulses applied to the MLC. During the program operation, a sequence of program pulses P1 to P10 including at least one set pulse and at least one reset pulse are applied to the MLC to make the resistance of the MLP failing within the target range Rtar. Each of the program pulses P1 to P10 may be a set pulse or a reset pulse depending on a relation between the resistance of the MLC and the target range Rtar. For example, when the resistance of the MLC is less than the lower limit RL of target range Rtar, the program pulse behaves like a reset pulse for increasing the resistance of the MLC. When the resistance of the MLC is greater than the upper limit RU of the target range Rtar, the program pulse behaves like a set pulse for decreasing the resistance Rcell of the MLC. Referring to FIG. 5, the program pulses P1 to P4 and P8 to P10 are considered as the reset pulses, and the program pulse P5 to P7 are considered as reset pulses.

Referring to FIG. 5, an initial resistance of the MLC before performing the programing operation is R1 which is less than the lower limit RL of the target range Rtar. Since the resistance R1 is less than the target range Rtar, the program operation is in a reset state. The program operation performs a reset operation to the MLC to increase the resistance of the MLC until the resistance of the MLC falls within the target range Rtar or until the resistance of the MLC passes beyond the target range Rtar. The memory controller may successively apply incremental step reset pulses P1, P2, P3 and P4 to the MLC to increase the resistance of the MLC to R2, R3, R4, and R5 respectively. The reset pulses P1, P2, P3 and P4 may be incremental step reset pulses with increasing amplitude, and a difference in amplitudes of two successive incremental step reset pulses is referred to as a reset step.

As shown in FIG. 5, after the reset pulse P4 is applied to the MLC, the resistance of the MLC increases from R4 which is less than the target range Rtar to R5 which is greater than the target range Rtar. In other words, the reset operation has excessively increased the resistance of the MLC, causing the resistance of the MLC passes beyond the target range Rtar. Since the resistance R5 of the MLC is greater than the target range Rtar, the program operation switches from the reset state to the set state to decrease the resistance of the MLC. The reset pulse P4 may be considered as the last reset pulse, and the amplitude of the last reset pulse P4 may be recorded in the LUT as the last reset condition (block 472 in FIG. 4B).

In the set state, the memory controller may successively apply the set pulses P5, P6 and P7 to the MLC to decrease the resistance of the MLC from R5 to R6, R7 and R8, respectively. The set pulses P5, P6 and P7 may be incremental step set pulses with increasing amplitude, and a difference in amplitudes of two successive incremental step set pulses is referred to as a set step. After the reset pulse P7 is applied to the MLC, the resistance of the MLC decreases from R4 which is greater than the target range Rtar to R8 which is less than the target range Rtar. Since the resistance R8 of the MLC is less than the target range Rtar, the program operation switches from the set state to the reset state again. The set pulse P7 may be considered as the last set pulse, and the amplitude of the last set pulse P7 may be recorded in the LUT as the last set condition (block 462 in FIG. 4B).

In the reset state, the memory controller may determine that the last reset condition (i.e., the amplitude of the last reset pulse P4) for programming the MLC to the target range Rtar has been recorded in the LUT. The memory controller may load the at least one of the amplitude, the pulse width or the pulse count of the last reset pulse from the LUT and adjust the last reset pulse to generate the reset pulses to be applied to the MLC. In some embodiments, the memory controller downsizes the at least one of the amplitude, the pulse width or the pulse count of the last reset pulse P4 by at least one step to generate the reset pulses P8, P9 and P10. In the reset state, the memory controller may successively apply the reset pulses P8, P9 and P10 until the resistance of the MLC fall within the target range Rtar. When the resistance of the MLC falls within the target range Rtar, the program operation ends successfully.

In some embodiments, there is a tradeoff between a programming speed and a resistance level repartition density of the MLC. The resistance level repartition density of the MLC may directly proportional to a number of storable resistance levels (i.e., storable logic states) of the MLC. When the number of storable resistance levels increases, a narrower target range Rtar corresponding to each storable resistance level is required. The narrower target range leads to longer programming time, because it takes a longer time to set the resistance of the MLC to fall within the narrower target range. In some embodiments, the number of the storable resistance levels and the target range Rtar corresponding to each resistance level of the MLC are determined based on designed requirements.

Figure 6:
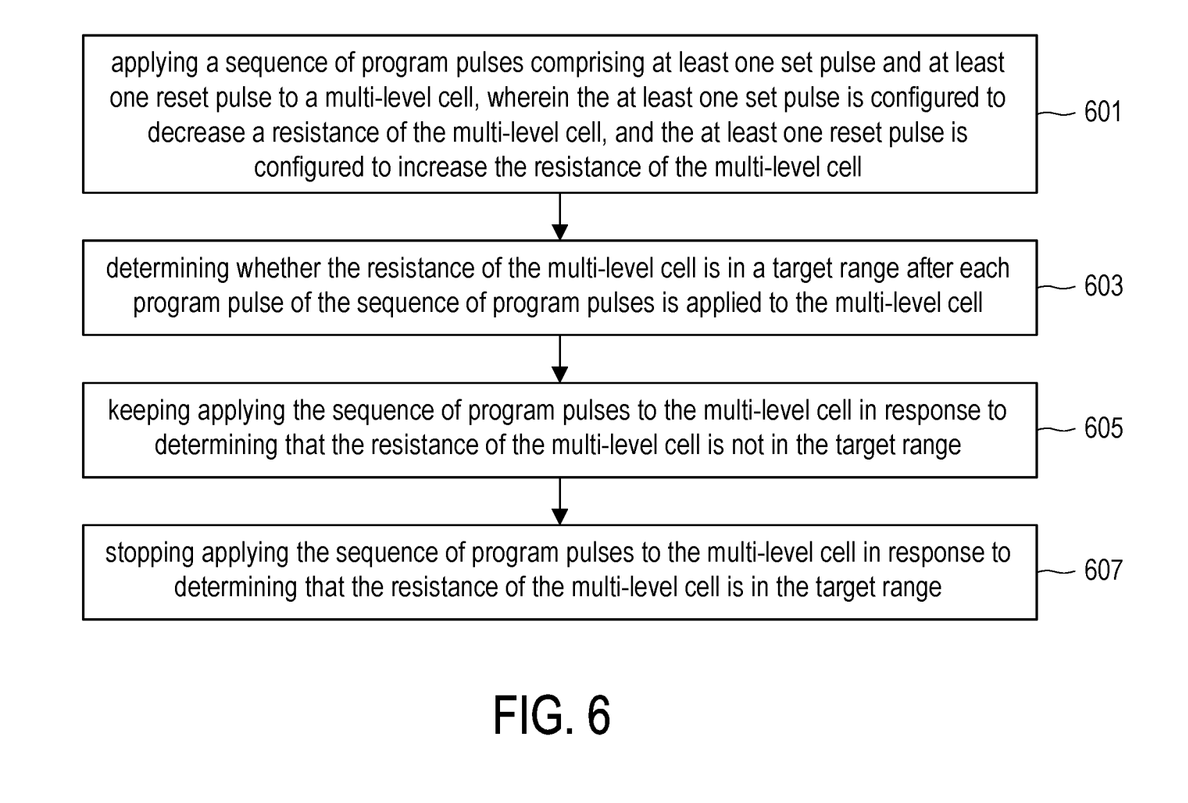
FIG. 6 is a flowchart diagram of a programming method of a memory device comprising a MLC in accordance with some embodiments.

FIG. 6 illustrates a flowchart diagram of a programming method of a memory device comprising a MLC in accordance with some embodiments. In block 601, a sequence of program pulses comprising at least one set pulse and at least one reset pulse are applied to a multi-level cell, wherein the at least one set pulse is configured to decrease a resistance of the multi-level cell, and the at least one reset pulse is configured to increase the resistance of the multi-level cell. In block 603, the programming method determines whether the resistance of the multi-level cell is in a target range after each program pulse of the sequence of program pulses is applied to the multi-level cell. In block 605, the programming method keeps applying the sequence of program pulses to the multi-level cell in response to determining that the resistance of the multi-level cell is not in the target range. In block 607, the programming method stops applying the sequence of program pulses to the multi-level cell in response to determining that the resistance of the multi-level cell is in the target range.

Figure 7:
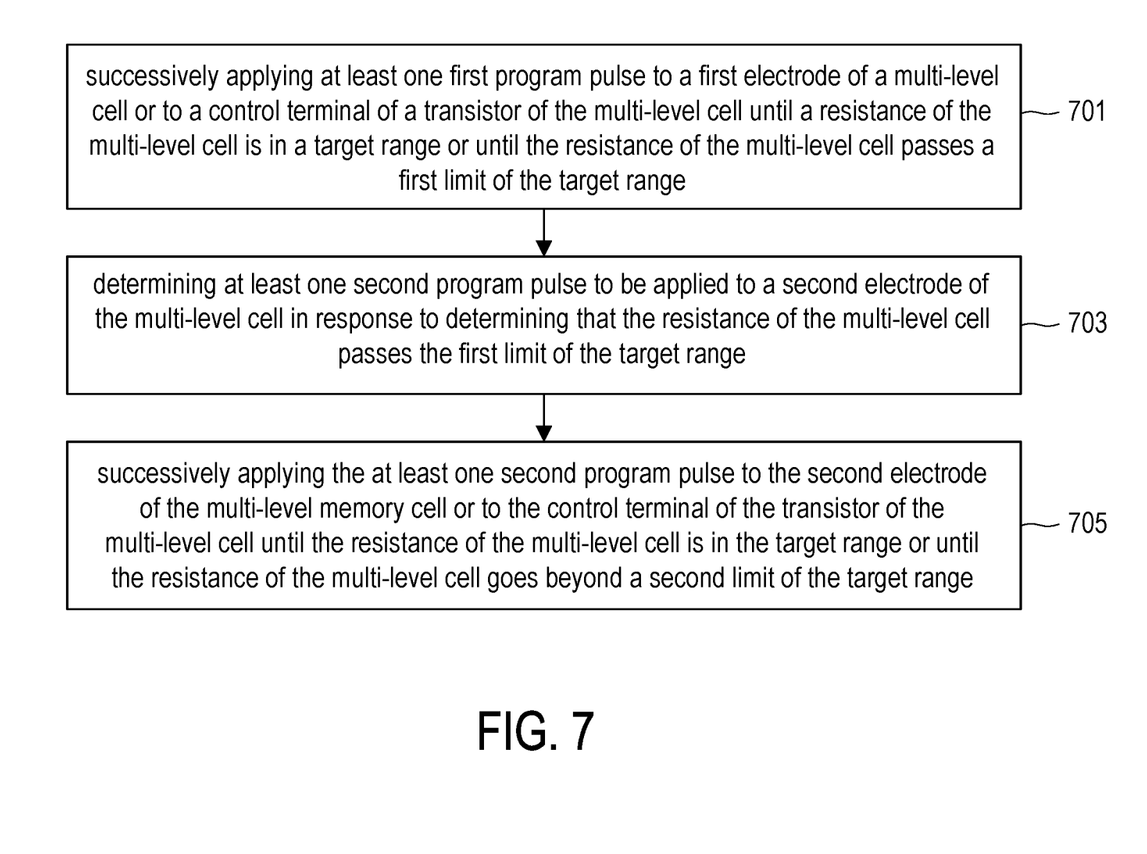
FIG. 7 is a flowchart diagram of a programming method of a memory device comprising a MLC in accordance with some embodiments.

FIG. 7 illustrates a flowchart diagram of a programming method of a memory device comprising a MLC in accordance with some embodiments. In block 701, at least one first program pulse is successively applied to a first electrode of the multi-level cell or to a control terminal of a transistor of the multi-level cell until a resistance of a multi-level cell is in a target range or until the resistance of the multi-level cell passes a first limit of the target range. In block 703, the programming method determines at least one second program pulse to be applied to a second electrode of the multi-level cell in response to determining that the resistance of the multi-level cell passes the first limit of the target range. In block 705, the programming method successively applies the at least one second program pulse to the second electrode of the multi-level memory cell or to the control terminal of the transistor of the multi-level cell until the resistance of the multi-level cell is in the target range or until the resistance of the multi-level cell goes beyond a second limit of the target range.

In accordance with some embodiments, a sequence of program pulses including at least one set pulse and at least one reset pulse are applied to a MLC during a single program operation. The at least one set pulse may include incremental step set pulses that are configured to decrease the resistance of the MLC. The at least one reset pulse may include incremental step reset pulses that are configured to increase the resistance of the MLC. In this way, the resistance of the MLC is precisely set to the target range regardless of variability (device-to-device variability and cycle-to-cycle variability) in the MLC and regardless of the number of storable resistance levels of the MLC. In addition, the spread of the resistance levels of the MLC, especially the resistance levels corresponding to the middle range of the memory window of the MLC, may be precisely controlled. In addition, the program operation may be tuned for better programming speed or denser resistance level repartition density. For example, a narrower target range of the MLC may result in slower programming speed and denser resistance level repartition density; and a wider target range of the MLC may result in faster programming speed and looser resistance level repartition density. Furthermore, A lookup table for storing the last set condition and the last reset condition for each resistance level of the MLC may contribute to a faster programing speed of the program operation on the MLC.

In some embodiments, a programming method of a memory device comprising a multi-level cell is introduced. The programming method includes a step of applying a sequence of program pulses comprising at least one set pulse and at least one reset pulse to the multi-level cell, wherein the at least one set pulse is configured to decrease a resistance of the multi-level cell, and the at least one reset pulse is configured to increase the resistance of the multi-level cell. The programming method further include steps of determining whether the resistance of the multi-level cell is in a target range after each program pulse of the sequence of program pulses is applied to the multi-level cell; keeping applying the sequence of program pulses to the multi-level cell in response to determining that the resistance of the multi-level cell is not in the target range; and stopping applying the sequence of program pulses to the multi-level cell in response to determining that the resistance of the multi-level cell is in the target range.

In some embodiments, a programming method of a memory device comprising a multi-level cell is introduced. The programming method includes steps of successively applying at least one first program pulse to a first electrode of the multi-level cell until a resistance of the multi-level cell is in a target range or until the resistance of the multi-level cell passes a first limit of the target range; determining at least one second program pulse to be applied to a second electrode of the multi-level cell in response to determining that the resistance of the multi-level cell passes the first limit of the target range; and successively applying the at least one second program pulse to the second electrode of the multi-level memory cell until the resistance of the multi-level cell is in the target range or until the resistance of the multi-level cell goes beyond a second limit of the target range.

In some embodiments, a memory device includes a memory array and a memory controller. The memory array includes a plurality of multi-level cells. The memory controller is coupled to the memory array and is configured to select a multi-level cell among the plurality of multi-level cells, apply a sequence of program pulses comprising at least one set pulse and at least one reset pulse to the multi-level cell, wherein the at least one set pulse is configured to reduce a resistance of the multi-level cell, and the at least one reset pulse is configured to increase the resistance of the multi-level cell. The memory controller is further configured to determine whether the resistance of the multi-level cell is in a target range after each program pulse of the sequence of program pulses is applied to the multi-level cell, keep applying the sequence of program pulses to the multi-level cell in response to determining that the resistance of the multi-level cell is not in the target range, and stop applying the sequence of program pulses to the multi-level cell in response to determining that the resistance of the multi-level cell is in the target range.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A programming method of a memory device comprising a multi-level cell, the programming method comprising:
applying a sequence of program pulses comprising at least one set pulse and at least one reset pulse to the multi-level cell, wherein the at least one set pulse is configured to decrease a resistance of the multi-level cell, and the at least one reset pulse is configured to increase the resistance of the multi-level cell;
determining whether the resistance of the multi-level cell is in a target range after each program pulse of the sequence of program pulses is applied to the multi-level cell;
keeping applying the sequence of program pulses to the multi-level cell in response to determining that the resistance of the multi-level cell is not in the target range; and
stopping applying the sequence of program pulses to the multi-level cell in response to determining that the resistance of the multi-level cell is in the target range,
wherein the at least one set pulse comprises incremental step set pulses, and the at least one reset pulse comprises incremental step reset pulses.

2. The programming method of claim 1, wherein the at least one set pulse is configured to reduce a resistance of the multi-level cell, and the at least one reset pulse is configured to increase the resistance of the multi-level cell.

3. The programming method of claim 1, wherein applying the sequence of program pulses comprising the at least one set pulse and the at least one reset pulse to the multi-level cell comprises:
successively applying at least one first program pulse to a first electrode of the multi-level cell or to a control terminal of a transistor of the multi-level cell until the resistance of the multi-level cell is in the target range or until the resistance of the multi-level cell passes a first limit of the target range;
determining at least one second program pulse to be applied to a second electrode of the multi-level cell in response to determining that the resistance of the multi-level cell passes the first limit of the target range; and
successively applying the at least one second program pulse to the second electrode of the multi-level memory cell or to the control terminal of the transistor of the multi-level cell until the resistance of the multi-level cell is in the target range or until the resistance of the multi-level cell goes beyond a second limit of the target range.

4. The programming method of claim 3, wherein
the at least one first program pulse is one of the at least one set pulse and the at least one reset pulse, and
the at least one second program pulse is another one of the at least one set pulse and the at least one reset pulse.

5. The programming method of claim 3, further comprising:
in response to determining that the resistance of the multi-level cell passes the first limit of the target range, recording at least one of an amplitude, a pulse width or a pulse count of a last program pulse of the at least one first program pulse to a lookup table; and
in response to determining that the resistance of the multi-level cell goes beyond the second limit of the target range, recording at least one of an amplitude, a pulse width or a pulse count of a last program pulse of the at least one second program pulse to the lookup table.

6. The programming method of claim 5, wherein applying the sequence of program pulses to the multi-level cell further comprises:
in response to determining that the resistance of the multi-level cell goes beyond the second limit of the target range, determining at least one third program pulse to be applied to the first electrode of the multi-level cell according to the at least one of the amplitude, the pulse width or the pulse count of the last program pulse of the at least one first program pulse recorded in the lookup table; and
applying the at least one third program pulse to the second electrode of the multi-level cell.

7. The programming method of claim 6, wherein determining the at least one third program pulse to be applied to the first electrode of the multi-level cell comprises:
determining the at least one of the amplitude, the pulse width or the pulse count of the last program pulse of the at least one first program pulse from the lookup table; and
adjusting the at least one of the amplitude, the pulse width or the pulse count of the last program pulse of the at least one first program pulse by at least one step of the at least one first program pulse to determine the at least one third program pulse,
wherein the step of at least one first program pulse is a difference in the at least one of the amplitude, the pulse width or the pulse count of successive pulses in the at least one first program pulse.

8. A memory device, comprising:
a memory array, comprising a plurality of multi-level cells; and
a memory controller, coupled to the memory array, configured to:
select a multi-level cell among the plurality of multi-level cells;
apply a sequence of program pulses comprising at least one set pulse and at least one reset pulse to the multi-level cell, wherein the at least one set pulse is configured to reduce a resistance of the multi-level cell, and the at least one reset pulse is configured to increase the resistance of the multi-level cell;
determine whether the resistance of the multi-level cell is in a target range after each program pulse of the sequence of program pulses is applied to the multi-level cell;
keep applying the sequence of program pulses to the multi-level cell in response to determining that the resistance of the multi-level cell is not in the target range; and
stop applying the sequence of program pulses to the multi-level cell in response to determining that the resistance of the multi-level cell is in the target range,
wherein the at least one set pulse comprises incremental step set pulses, and the at least one reset pulse comprises a series of incremental step reset pulses.

9. The memory device of claim 8, wherein the memory controller is further configured to:

successively apply at least one first program pulse to a first electrode of the multi-level cell or to a control terminal of a transistor of the multi-level cell until the resistance of the multi-level cell is in the target range or until the resistance of the multi-level cell passes a first limit of the target range;

determine at least one second program pulse to be applied to a second electrode of the multi-level cell in response to determining that the resistance of the multi-level cell passes the first limit of the target range; and successively apply the at least one second program pulse to the second electrode of the multi-level memory cell or to the control terminal of the transistor of the multi-level cell until the resistance of the multi-level cell is in the target range or until the resistance of the multi-level cell goes beyond a second limit of the target range, wherein the at least one first program pulse and at least one second program pulse are incremental step program pulses.

10. The memory device of claim 9, wherein
the at least one first program pulse is one of the at least one set pulse and the at least one reset pulse, and
the at least one second program pulse is another one of the at least one set pulse and the at least one reset pulse.

11. The memory device of claim 9, wherein the memory controller is further configured to:
in response to determining that the resistance of the multi-level cell passes the first limit of the target range, record an amplitude a last program pulse of the at least one first program pulse to a lookup table; and
in response to determining that the resistance of the multi-level cell goes beyond the second limit of the target range, record an amplitude a last program pulse of the at least one second program pulse to the lookup table.

12. The memory device of claim 11, wherein the memory controller is further configured to:
in response to determining that the resistance of the multi-level cell goes beyond the second limit of the target range, determine at least one third program pulse to be applied to the first electrode of the multi-level cell according to the amplitude of the last program pulse of the at least one first program pulse recorded in the lookup table; and
apply the at least one third program pulse to the second electrode of the multi-level cell.

13. The memory device of claim 11, wherein the memory controller is further configured to:
determine the at least one of the amplitude, the pulse width or the pulse count of the last program pulse of the at least one first program pulse from the lookup table;
adjust the at least one of the amplitude, the pulse width or the pulse count of the last program pulse of the at least one first program pulse by at least one step of the at least one first program pulse to determine the at least one third program pulse,
wherein the step of at least one first program pulse is a difference in the at least one of the amplitude, the pulse width or the pulse count of successive pulses in the at least one first program pulse.

14. A programming method of a memory device comprising a multi-level cell, the programming method comprising:
applying a sequence of program pulses comprising at least one set pulse and at least one reset pulse to the multi-level cell, wherein the at least one set pulse is configured to decrease a resistance of the multi-level cell, and the at least one reset pulse is configured to increase the resistance of the multi-level cell;

determining whether the resistance of the multi-level cell is in a target range after each program pulse of the sequence of program pulses is applied to the multi-level cell;

keeping applying the sequence of program pulses to the multi-level cell in response to determining that the resistance of the multi-level cell is not in the target range; and stopping applying the sequence of program pulses to the multi-level cell in response to determining that the resistance of the multi-level cell is in the target range, wherein applying the sequence of program pulses comprising the at least one set pulse and the at least one reset pulse to the multi-level cell comprises:

successively applying at least one first program pulse to a first electrode of the multi-level cell or to a control terminal of a transistor of the multi-level cell until the resistance of the multi-level cell is in the target range or until the resistance of the multi-level cell passes a first limit of the target range;

determining at least one second program pulse to be applied to a second electrode of the multi-level cell in response to determining that the resistance of the multi-level cell passes the first limit of the target range; and successively applying the at least one second program pulse to the second electrode of the multi-level memory cell or to the control terminal of the transistor of the multi-level cell until the resistance of the multi-level cell is in the target range or until the resistance of the multi-level cell goes beyond a second limit of the target range.

15. The programming method of claim 14, wherein
the at least one first program pulse is one of the at least one reset pulse, and
the at least one second program pulse is another one of the at least one set pulse and the at least one reset pulse.

16. The programming method of claim 15, wherein
the at least one set pulse comprises incremental step set pulses that are configured to decrease the resistance of the multi-level cell, and
the at least one reset pulse comprises incremental step reset pulses that are configured to increase the resistance of the multi-level cell.

17. The programming method of claim 14, further comprising:
in response to determining that the resistance of the multi-level cell passes the first limit of the target range, recording at least one of an amplitude, a pulse width or a pulse count of a last program pulse of the at least one first program pulse to a lookup table; and
in response to determining that the resistance of the multi-level cell goes beyond the second limit of the target range, recording at least one of an amplitude, a pulse width or a pulse count of a last program pulse of the at least one second program pulse to the lookup table.

18. The programming method of claim 17, further comprising:
in response to determining that the resistance of the multi-level cell goes beyond the second limit of the target range, determining at least one third program pulse to be applied to the first electrode of the multi-level cell according to the at least one of the amplitude, the pulse width or the pulse count of the last program pulse of the at least one first program pulse recorded in the lookup table; and applying the at least one third program pulse to the second electrode of the multi-level cell.

19. The programming method of claim 18, wherein determining the at least one third program pulse to be applied to the first electrode of the multi-level cell comprises:

determining the at least one of the amplitude, the pulse width or the pulse count of the last program pulse of the at least one first program pulse from the lookup table;

adjusting the at least one of the amplitude, the pulse width or the pulse count of the last program pulse of the at least one first program pulse by at least one step of the at least one first program pulse to determine the at least one third program pulse, wherein the step of at least one first program pulse is a difference in the at least one of the amplitude, the pulse width or the pulse count of successive pulses in the at least one first program pulse.

20. The programming method of claim 14, wherein the at least one set pulse is configured to reduce a resistance of the multi-level cell, and the at least one reset pulse is configured to increase the resistance of the multi-level cell.

\* \* \* \* \*